(12) United States Patent
Ritter

(10) Patent No.: US 10,096,419 B2
(45) Date of Patent: Oct. 9, 2018

(54) COMMON MODE CHOKE

(71) Applicant: Nexperia B.V., Nijmegen (NL)

(72) Inventor: Hans-Martin Ritter, Hamburg (DE)

(73) Assignee: Nexperia B.V., Nijmegen (NL)

( * ) Notice: Subject to any disclaimer, the term of this patent is extended or adjusted under 35 U.S.C. 154(b) by 241 days.

(21) Appl. No.: 14/984,614

(22) Filed: Dec. 30, 2015

(65) Prior Publication Data

US 2016/0211068 A1 Jul. 21, 2016

(30) Foreign Application Priority Data

Jan. 20, 2015 (EP) .................................... 15151828

(51) Int. Cl.
*H01F 27/28* (2006.01)
*H03H 7/42* (2006.01)
*H01F 17/00* (2006.01)

(52) U.S. Cl.
CPC ......... *H01F 27/2804* (2013.01); *H03H 7/427* (2013.01); *H01F 2017/0093* (2013.01)

(58) Field of Classification Search
USPC ........................................ 336/220, 222, 232
See application file for complete search history.

(56) References Cited

U.S. PATENT DOCUMENTS

| | | | | |
|---|---|---|---|---|
| 4,425,511 A * | 1/1984 | Brosh | ..................... | H03K 17/97 307/106 |
| 6,097,273 A * | 8/2000 | Frye | ......................... | H01F 5/003 333/25 |
| 6,842,158 B2 * | 1/2005 | Jo | ........................... | H01Q 1/243 343/700 MS |
| 2003/0117227 A1 * | 6/2003 | Escalera | ................... | H01P 5/10 333/26 |
| 2010/0045418 A1 * | 2/2010 | Nishikawa | ............ | H01F 17/045 336/192 |
| 2010/0066474 A1 * | 3/2010 | Huang | .................. | H01F 27/289 336/73 |
| 2011/0043316 A1 * | 2/2011 | Yang | ....................... | H01F 19/04 336/192 |
| 2013/0181803 A1 * | 7/2013 | Wyville | .................. | H01F 19/04 336/232 |

FOREIGN PATENT DOCUMENTS

JP 2007-266140 A 10/2007

OTHER PUBLICATIONS

Extended European Search Report for EP Patent Appln. No. 15151828.9 (dated May 7, 2015).
Extended European Search Report for Patent Appln. No. 15151828.9 (dated May 7, 2015).

* cited by examiner

*Primary Examiner* — Elvin G Enad
*Assistant Examiner* — Kazi Hossain
(74) *Attorney, Agent, or Firm* — Ohlandt, Greeley, Ruggiero & Perle, L.L.P.

(57) ABSTRACT

A common mode choke comprising a first planar coil for receiving a first signal, a second planar coil for receiving a second signal, the first and second coils comprising substantially mirror images of one another and arranged side by side in a common plane, the first planar coil and second planar coil electromagnetically coupled by a closed coupling loop.

15 Claims, 4 Drawing Sheets

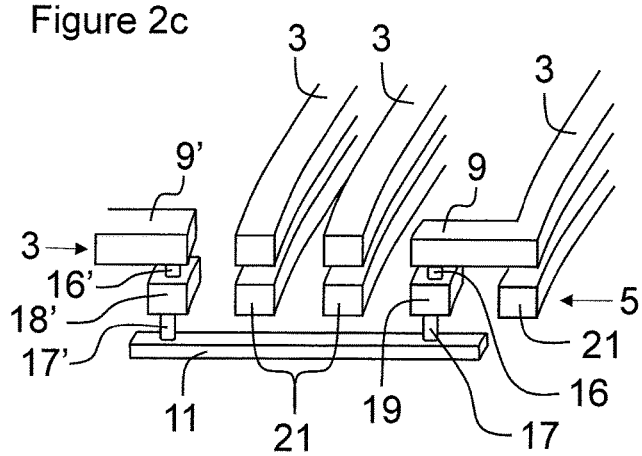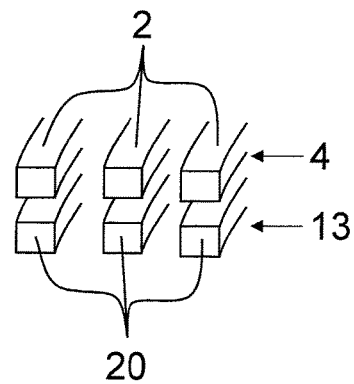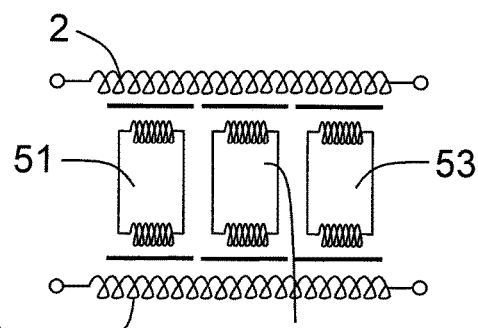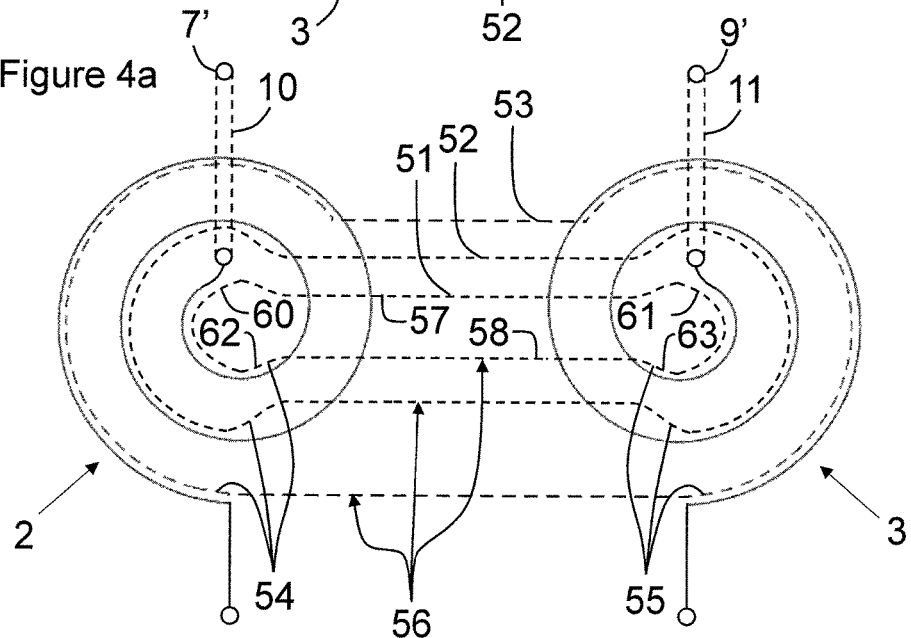

COMMON MODE CHOKE

CROSS-REFERENCE TO RELATED APPLICATIONS

This application claims the priority under 35 U.S.C. § 119 of European Patent application no. 15151828.9, filed on Jan. 20, 2015, the contents of which are incorporated by reference herein.

This disclosure relates to a common mode choke. In particular, it relates to a planar, metal on silicon common mode choke configured to operate on a differential signal. The disclosure also relates to an electronic device that utilises the common mode choke to filter a signal.

According to a first aspect we provide a common mode choke comprising a first planar coil for receiving a first signal, a second planar coil for receiving a second signal, the first and second coils comprising substantially mirror images of one another and arranged side by side in a common plane, the first planar coil and second planar coil electromagnetically coupled by a closed coupling loop.

This is advantageous as by providing the first and second planar coils side-by-side rather than face to face, the planar coils (the signal receiving coils) of the common mode choke can be arranged symmetrically. Thus, the closed coupling loop provides for the magnetic coupling of the planar coils.

The closed coupling loop may be substantially planar and configured to extend, at least in part, in a plane adjacent but spaced from the common plane. This arrangement is advantageous as the common mode choke may be provided in a plurality of metal layers in a silicon substrate, for example. The closed coupling loop may be symmetrical. The closed coupling loop may extend in the common plane alongside the first planar coil and the second planar coil.

The closed coupling loop may comprise a first coil portion arranged complementary to at least a portion of the first planar coil, a second coil portion arranged complementary to at least a portion of the second planar coil and a connecting portion arranged to connect the first and second coil portions to form a closed loop. Thus, the coil portions may be configured to track the planar coils to magnetically couple thereto and the connecting portion provides the link between the coil portions to magnetically couple the planar coils together.

The connecting portion comprises a first track and a second track, the first track configured to connect a first end of the first coil portion to a complementary first end of the second coil portion and the second track configured to connect a second end of the first coil portion to a complementary second end of the second coil portion, the first and second tracks configured to extend in different planes.

The connecting portion may comprise a first track and a second track, the first track configured to connect a first end of the first coil portion to a complementary first end of the second coil portion and the second track configured to connect a second end of the first coil portion to a complementary second end of the second coil portion, the first and second tracks configured to extend in the same plane. This is advantageous as the common mode choke may be provided over two metal layers.

The common mode choke may be symmetrical about a plane extending between the first and second planar coils. A symmetrical common mode choke may provide low signal distortion.

A plurality of closed coupling loops may be provided each configured to electromagnetically couple the first and second planar coils. Thus, each closed coupling loop may be complementary to only part of the first planar coil and to only part of the second planar coil, with each of the closed coupling loops covering a different part of the first and second coils.

At least two of the plurality of closed coupling loops may extend in the same plane. Optionally, all of the closed coupling loops extend in the same plane.

A first of the plurality of closed coupling loops may extend in plane above the common plane and a second of the plurality of closed coupling loops extends in plane below the common plane.

The first planar coil may include a straight section and a coiled section and the second planar coil may include a straight section and a coiled section, wherein the straight sections of the first and second planar coils are arranged parallel to one another.

The number of closed coupling loops may be equal to or one greater than the number of turns of the first or second planar coil.

The first and/or second planar coils may comprise spirals and have an outer spiral end and an inner spiral end arranged in the common plane. The or each inner spiral end may connect to a bridge track that extends in a plane adjacent to but spaced from the common plane to provide a connection point that lies outside of the spiral.

The first and second planar coils may comprise at least 1.5 turns or at least 2 turns or at least 2.5 turns.

The first planar coil and the second planar coil may be each arranged over a plurality of parallel planes, with corresponding parts of the first planar coil and the second planar coil arranged in common planes of the plurality of parallel planes. Thus, the first and second planar coil parts that extend in common planes are substantially mirror images of one another. The closed coupling loop may or may not extend in a plane different to the first and second planar coils.

The first and second planar coils may be spirals and each may have an outer spiral end and an inner spiral end and the common mode choke, including the closed coupling loop, may extend over only three layers including bridge tracks to provide a connection between the inner spiral ends and a point outside the spirals. Alternatively, the first and second planar coils may be spirals and each may have an outer spiral end and an inner spiral end and the common mode choke, including the closed coupling loop, may extend over only two layers including bridge tracks to provide a connection between the inner ends and a point outside the spirals.

According to a further aspect we provide an electronic device including the common mode choke of the first aspect.

The electronic device may comprise a transmitter or a receiver configured to transmit or receive a signal arranged over two signal channels wherein the first planar coil of the common mode choke is configured to connect to one of the two signal channels and the second planar coil of the common mode choke is configured to connect to the other of the two signal channels.

There now follows, by way of example only, a detailed description of embodiments of the disclosure with reference to the following figures, in which:

FIG. 2b shows a side view of the layout of FIG. 2a;

FIG. 2c shows a perspective view of a cross section through A-A of the layout of FIG. 2a;

FIG. 2d shows a perspective view of a cross section through B-B of the layout of FIG. 2a;

FIG. 3 shows a diagram representative of a second example common mode choke;

FIG. 4a shows a plan view of the layout of the second example common mode choke represented in FIG. 3;

FIG. 4b shows a side view of the layout of FIG. 4a;

Figure 1:
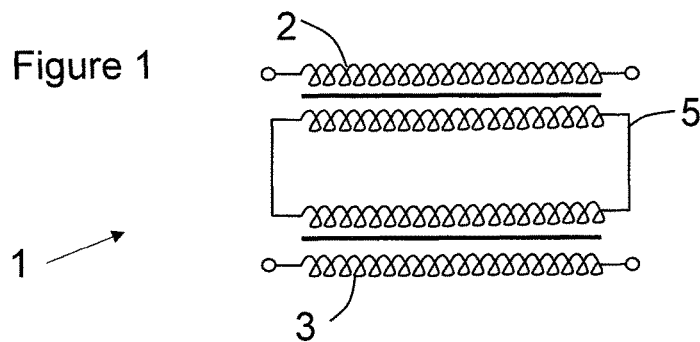
FIG. 1 shows a diagram representative of an example common mode choke.
Figure 2A:
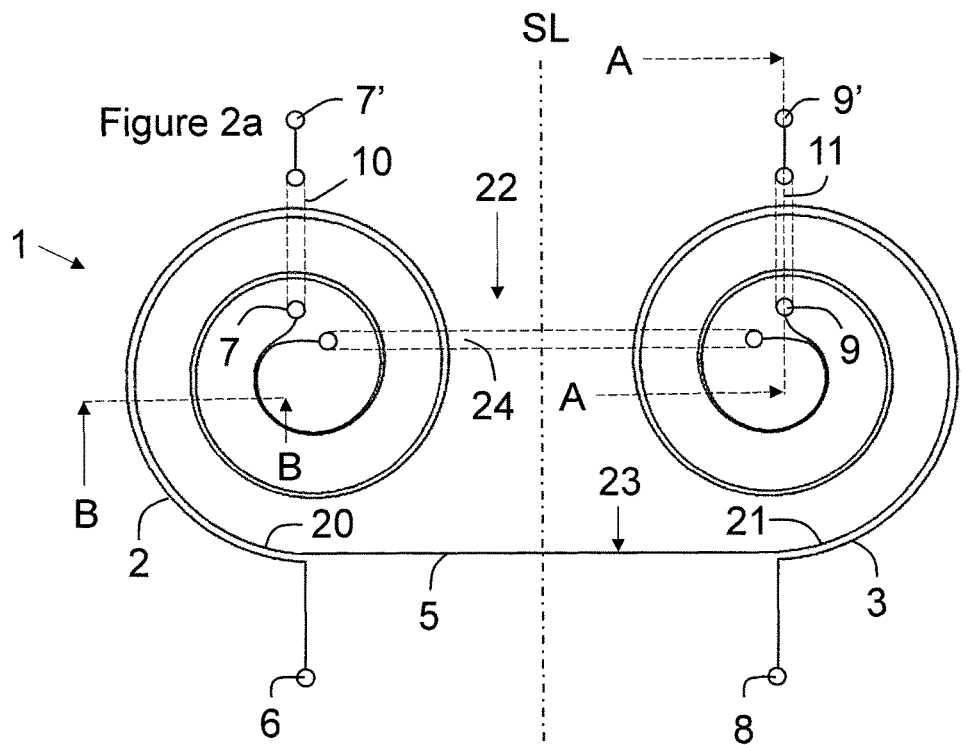
FIG. 2a shows a plan view of the layout of the example common mode choke represented in FIG. 1.

FIGS. 1 and 2a show a common mode choke 1 having a first planar coil 2 forming a first signal channel and a second planar coil 3 forming a second signal channel. The first signal channel is configured to receive a first signal and the second signal channel is configured to receive a second signal. The first signal and second signal comprise component parts of a differentially transmitted signal. The common mode choke 1 is configured to receive the differential signal over the two signal channels and attenuate common mode signals thereof and allow the differential signals to pass.

The first planar coil 2 and the second planar coil 3 are substantially mirror images of one another and arranged side by side in a common plane 4. The first planar coil 2 and second planar coil 3 are electromagnetically coupled to one another by a closed coupling loop 5. The common mode choke 1 is substantially symmetrical along a plane SL that extends between the first and second planar coils 2, 3 and perpendicular thereto. The symmetrical common mode choke 1 may have advantages over asymmetrical common mode chokes.

The first planar coil 2 and the second planar coil 3 are formed as a track in a metal layer on a substrate, such as a silicon substrate. The coils 2, 3 each have substantially 2.5 turns, although it will be appreciated the coils could have other numbers of turns. The coils 2, 3 are, in this example, spirals and thus comprise a tightening curve. The planar coils 2, 3 extend over one metal layer of the silicon substrate. The first planar coil 2 includes a first terminal 6 and a second terminal 7. The first and second terminals 6 and 7 form an input and an output terminal for the first signal channel. The second planar coil 3 includes a first terminal 8 and a second terminal 9. The first and second terminals 8 and 9 form an input and an output terminal for the second signal channel.

The second terminal 7 of the first planar coil and the second terminal 9 of the second planar coil 3 may be configured to connect to a respective first and second bridge track 10, 11. The bridge tracks 10 and 11 are configured to provide a connection point 7', 9' (shown also in FIG. 2c) to the second terminals 7 and 9 that is located outside the first and second planar coils 2, 3. The first and second bridge tracks 10, 11 extend in a third plane 12, aligned with but spaced from the common plane 4. In some examples, the bridge tracks 10, 11 may be provided in a top metal layer of a die (not shown) in which the common mode choke is formed.

Figure 2B:
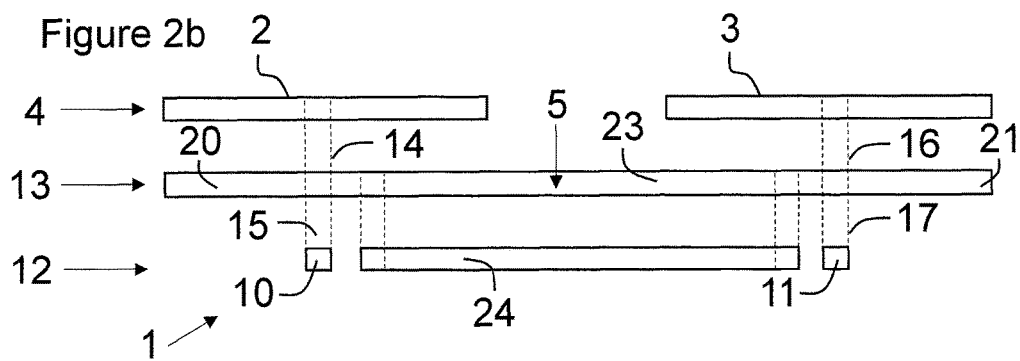

The coupling loop 5 comprises a closed loop and is thus short circuited. The coupling loop 5, although shown extending slightly alongside the first and second planar coils 2, 3 in FIG. 2a, is, in fact, configured to extend in a different plane and follow the first and second planar coils 2, 3 at least in part. FIG. 2b shows the coupling coil 5 extending in a second plane 13 aligned with but spaced from the common plane 4 and the third plane 12. The second plane 13 extends between the common plane 4 and the third plane 12. Thus, the second terminal 7 of the first planar coil 2 extends by way of a via 14 to a metal pad (not shown) in the second plane 13 and then onto the first bridge track 10 by way of a second via 15. Likewise, the second terminal 9 of the second planar coil 3 extends by way of a via 16 to a metal pad 19 (shown in FIG. 2c) in the second plane 13 and then onto the second bridge track 11 by way of a second via 17. With reference to FIG. 2c, the second bridge track 11 extends to a metal pad 19' in the second plane 13 by way of a via 17' and onto the connection point 9' in the common plate 4 by way of a via 16'.

The closed coupling loop 5 comprises a first coil portion 20 arranged complementary to at least a part of the first planar coil 2 and a second coil portion 21 arranged complementary to at least a part of the second planar coil 3. The first and second coil portions 20, 21 are connected together by a connecting portion 22 to form a closed loop. FIG. 2d, which comprises section through B-B of FIG. 2a, shows the tracks of the first coil 2 in the common plane 4 and the tracks of the first coil portion 20 of the coupling loop 5 arranged complementary to the first coil 2 in the second plane 13. Thus, the tracks in different planes may be aligned. The connecting portion comprises two connector tracks; a first connector track 23 and a second connector track 24 arranged to extend between the two coil portions 20, 21. Given that the first and second coil portions 20 and 21 track the first and second planar coils 2, 3, they are spirals and thus have outer spiral ends and inner spiral ends. The outer spiral ends of the first and second coil portions 20 and 21 are connected together by the first connector track 23, which extends in the same plane as the coil portions 20, 21 (the second plane 13 in this example). The second connector track 24, which connects to the inner spiral ends of the first and second coil portions 20 and 21 is required to traverse the first and second coil portions 20 and 21 in order to close the coupling loop 5. Accordingly, the second connector track 24 extends in a different plane to the remainder of the coupling loop 5 so that it can traverse the coils of the first and second coil portions. The closed coupling loop 5 is thus substantially planar and extends over a single plane except for a portion (the second connector track 24) that extends between the coil portions 20, 21. The second connector track 24, in this example, extends in the same plane as the bridge tracks 10, 11, which may be a top metal layer of a die (not shown). Thus, the common mode choke 1, in this example, is provided over three metal layers of a silicon substrate. One or all of the substantially two-dimensional layer may be symmetrical about a line extending between planar coils. Further, as the common mode choke 1 extends in several layers it is also substantially symmetrical about a plane aligned with symmetry line SL that extends between the first and second planar coils 2, 3 and orthogonal to the common plane 4, the second plane 13 and the third plane 12.

In use, the common mode choke 1 is provided with a differentially signalled signal, which is provided over two lines. The first line is connected to the first terminal 6 and the second line is connected to the first terminal 8. The second terminal 7 comprises an output from the first coil 2 and the second terminal 9 provides an output from the second coil 3. The two lines of the differential data channel will see the same impedances when passing through the symmetric common mode choke 1. This may result in reduced data distortion compared to asymmetric layouts.

Figure 4B:
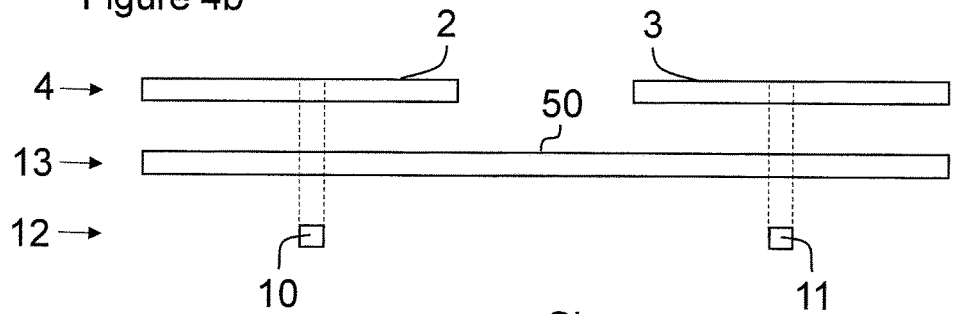

FIGS. 3, 4a and 4b show a second example in which a plurality of coupling loops 50 are provided to electromagnetically couple the first and second planar coils. The same reference numerals have been used for identical parts. The first planar coil 2 and the second planar coil 3 have substantially the same layout as shown in FIG. 2a. However, it will be appreciated that other planar coil shapes are possible. Further, the planar coils 2, 3 connect to first and second bridge tracks 10 and 11 to provide a connection point 7', 9' that is located outside the first and second planar coils 2, 3

The coupling loops 50 each comprise closed loops and are each configured to electromagnetically couple the first and second planar coils 2, 3. In this example, three closed coupling loops 51, 52, 53 are provided. The three closed coupling loops 51, 52, 53 are, in this example, concentric. Further, the loops 50 all lie in the same plane arranged one inside the other. It will be appreciated that in other embodiments, the coupling loops 50 may be provided in different planes or layers. For example, one or more closed coupling loops may extend in plane above the common plane 4 and one or more closed coupling loops may extend in plane below the common plane 4. However, in this example, the common mode choke 1 (comprising the planar coils 2, 3 and the coupling coils 50) is provided over two metal layers of a silicon substrate (as shown in FIG. 4b). The bridge tracks 10, 11 which connect to the first and second planar coils 2, 3 are provided in a third layer 12 but other connections to the second terminal 7 and the second terminal 9 are possible.

Each closed coupling loop 51, 52, 53 comprises a first coil portion 54 arranged complementary to part of the first planar coil 2 and a second coil portion 55 arranged complementary to part of the second planar coil 3. The first and second coil portions 54, 55 are connected together by a connecting portion 56 to form a closed loop. The connecting portion 56 comprises a first track 57 and a second track 58. The first track 57 is configured to connect a first end 60 of the first coil portion 54 to a complementary first end 61 of the second coil portion 55 and the second track 58 is configured to connect a second end 62 of the first coil portion 54 to a complementary second end 63 of the second coil portion 55. Unlike the first example described above, the first and second tracks 57, 58 of the connecting portion 56 extend in the same plane 13.

The first coil portion 54 comprises less than one turn and tracks part of the first planar coil 2. Likewise, the second coil portion 55 comprises less than one turn and tracks part of the second planar coil 3. The number of coupling coils may be sufficient to track each turn or part turn of the planar coils 2, 3. For example, the first and second planar coils 2, 3 have approximately 2.5 turns and thus three coil turns intersect a radially extending plane centred on the planar coils 2, 3 at at least one radial position. Accordingly, an equivalent number (three) of coupling coils 50 are provided. It will be appreciated that other numbers of a coupling coils 50 may be provided, which may or may not be related to the number of turns of the first and/or second planar coils 2, 3.

Figure 5:
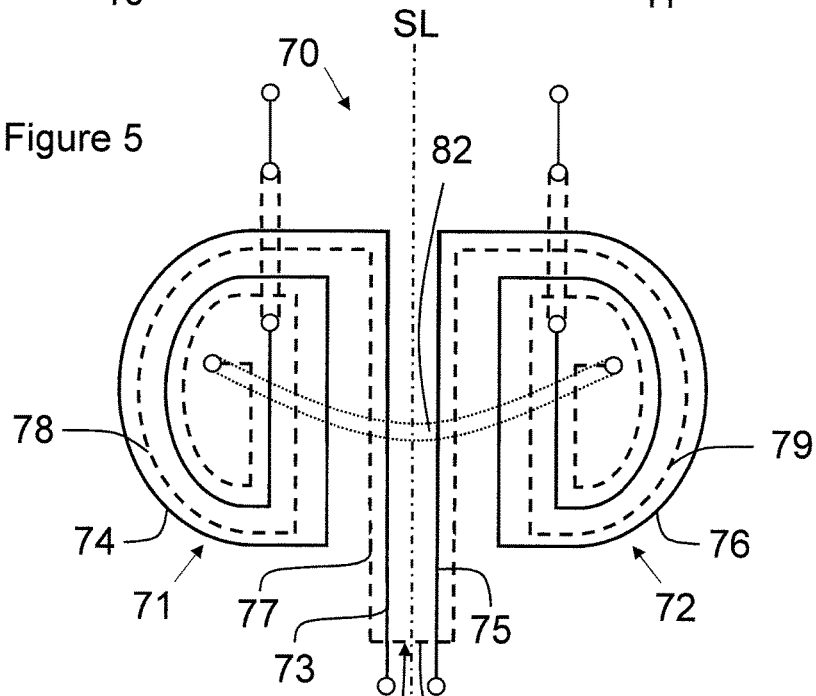
FIG. 5 shows a diagram representative of a third example common mode choke.

FIG. 5 shows a further example layout comprising a symmetrical common mode choke 70. The same reference numerals have been used for identical parts. In this example the first and second planar coils 71, 72 have a different shape. In particular, the first planar coil 71 includes a straight section 73 and a coiled section 74. Likewise, the second planar coil 72 includes a straight section 75 and a coiled section 76. The first and second planar coils are mirror images of one another and accordingly coil in opposite directions (anti-clockwise and clockwise respectively for example). The straight sections 73, 75 of the first and second planar coils 71, 72 are arranged parallel to one another adjacent a line of symmetry SL of the common mode choke 70.

A single coupling coil 77 is provided and comprises a closed loop. The coupling coil 77 is shown in dashed lines in FIG. 5 and alongside the first and second planar coils 71, 72. However, it will be appreciated that the coupling coil 77 is arranged in an adjacent plane aligned with but spaced from the plane in which the first and second planar coils lie. As in the example shown in relation to FIG. 2a, the coupling coil 77 comprises a first coil portion 78 and a second coil portion 79 connected together by a connecting portion 80. The connecting portion 80 comprises two connector tracks; a first connector track 81 and a second connector track 82 arranged to extend between the two coil portions 78, 79. The first and second coil portions 78 and 79 track the first and second planar coils 71, 72 (in their adjacent plane or layer) and thus they are spirals and have outer spiral ends and inner spiral ends. The outer spiral ends of the first and second coil portions 78 and 79 are connected together by the first connector track 81, which extends in the same plane as the coil portions 78, 79 (the second plane 13 in this example). The second connector track 82, which connects to the inner spiral ends of the first and second coil portions 78 and 79 is required to traverse the first and second coil portions 78 and 79 in order to close the coupling loop 5. Accordingly, the second connector track 82 extends in a different plane to the remainder of the coupling loop 77 so that it can traverse the coils of the first and second coil portions 78, 79. The closed coupling loop 77 is thus substantially planar and extends over a single plane except for a portion (the second connector track 82) that extends between the coil portions. In FIG. 5, the second connector track is shown schematically and in practice may have a layout closer to that described for the second connector track 24 of FIGS. 2a and 2b.

Figure 6:
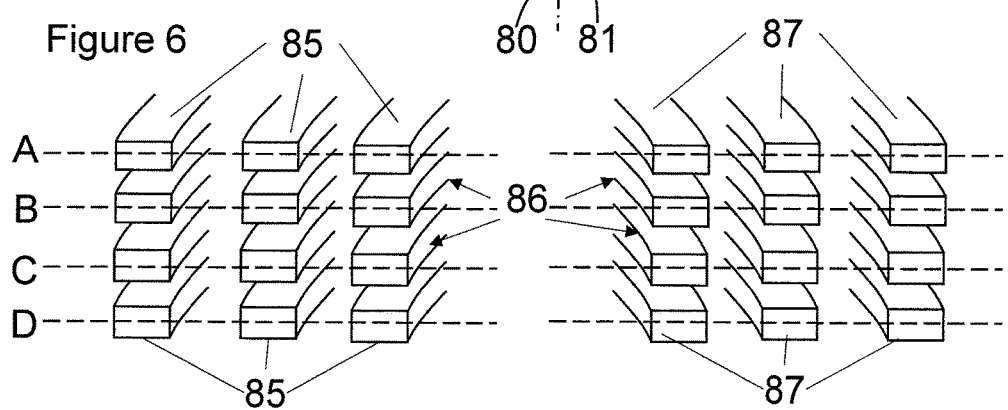
FIG. 6 shows an example common mode choke in which the first and second planar coils extend in more than one parallel plane.

FIG. 6 shows a sectional view through part of a first planar coil 85 and a closed coupling loop 86 and an equivalent part of a second planar coil 87. Only the outermost turns of each of the coils/loop 85, 86, 87 are shown. In this example, the first planar coil 85 extends over two planes A, D (connected by vias between the layers (not shown)). Corresponding but mirror image parts of the second planar coil 87 extend over the planes A, D. The first and second planar coils thus extend over common planes. The first and second planar coils can be each considered to comprise a first part that extends in a first plane and a second part that extends in a second plane. The corresponding parts are substantially mirror images of one another and the corresponding parts each extend in common planes. Thus, the first part of the first planar coil 85 extends in common plane A with the corresponding first part of the second planar coil 86. Likewise, the second part of the first planar coil 85 extends in common plane D with the corresponding second part of the second planar coil 86. The closed coupling loop 86 may also extend over two planes B, C to magnetically couple the first and second parts of the first and second planar coils 85, 86. It will be appreciated that the relative positions of the first and second planar coils 85, 87 and the closed coupling loop in the planes A-D may be different provided that corresponding parts, i.e. mirror image parts, of each of the first and second planar coils lie in common planes.

Figure 7:
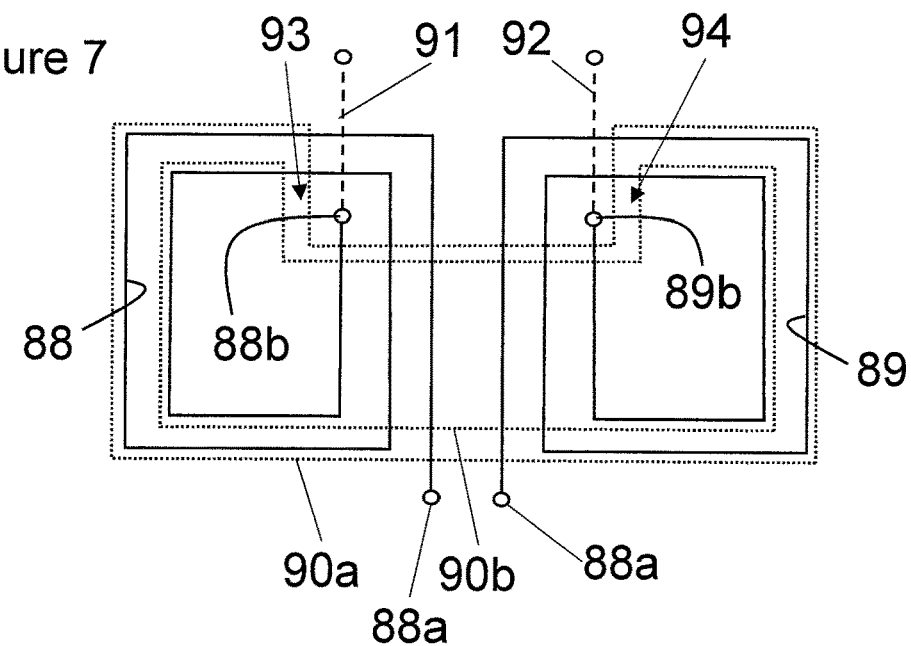
FIG. 7 shows an example common mode choke formed in only two layers.

FIG. 7 shows a further example common mode choke in which the first planar coil, second planar coil, the closed coupling loop and bridge tracks are provided in only two layers. In particular, the first planar coil 88 and the second planar coil 89 are provided in a single common plane, which comprises a first layer. The first planar coil includes an outer spiral end 88*a* and in inner spiral end 88*b*. Likewise, the second planar coil includes an outer spiral end 89*a* and an inner spiral end 89*b*. The closed coupling loop 90, shown in dotted lines, comprises a plurality of loops (two) 90*a*, 90*b*. The closed coupling loop 90 is formed in a second layer, parallel to and spaced from the first layer. Thus, although the closed coupling loop 90 and first and second planar coils 88, 89 are shown in FIG. 7 as extending side by side (for clarity) they, in fact, directly overlie one another in the parallel first and second layers. The closed coupling loops 90 are configured to extend inwardly, in plan view, of the inner spiral ends 88*b*, 89*b*. In particular, the closed coupling loops each include a divergent section 93, 94 in which they leave a path that substantially tracks the first planar coil or second planar coil such that they extend inwardly of the inner spiral ends 88*b*, 89*b*. Accordingly, bridge tracks 91, 92, which connect the inner spiral ends 89*a*, 89*b* to outside the plan of the spiral coils 88, 89, are able to extend in the same plane as the closed coupling loop 90. It will also be appreciated that the first and second planar coils 88, 89 in this example are of spiral shape but extend in an annular region rather than spiralling to a point central to the spiral.

Figure 8:
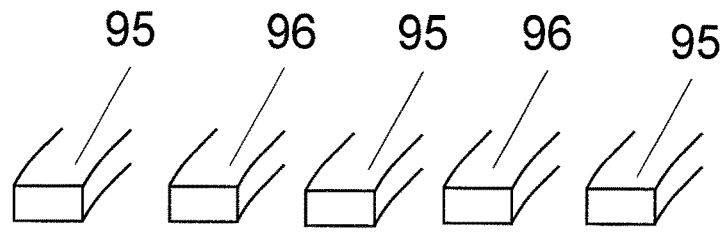
FIG. 8 shows an example common mode choke in which the first and second planar coils have a bifilar arrangement with the closed coupling loop.

FIG. 8 shows part of an example common mode choke in which the first and second planar coils are wound bifilar with the closed coupling loop. Thus, while in FIG. 2*a* described above the closed coupling loop is shown in a different layer to the first and second planar coils, in this example the first planar coil is inter-wound with the closed coupling loop and the second planar coil is inter-wound with the closed coupling loop. Thus, in section the coils and the closed coupling loop extend in the same plane albeit for any bridge tracks. FIG. 8 shows the first planar coil 95 inter-wound with the closed coupling loop 96. Three turns of the first planar coil 95 are shown and two turns of the closed coupling loop 96.

Figure 9:
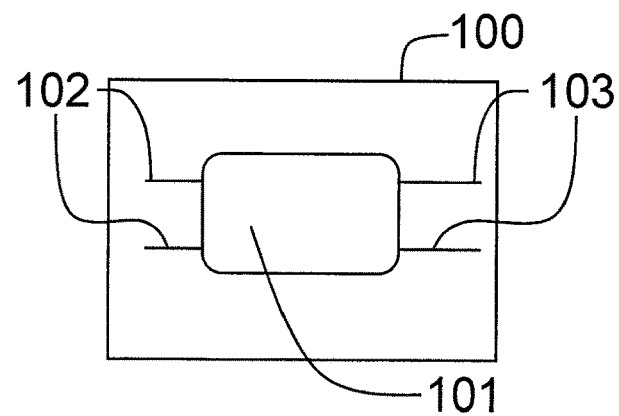
FIG. 9 shows an example electronic device.

FIG. 9 shows an electronic device 100 which may comprise a transmitter or receiver of a telecommunications network. The device 100 includes a common mode choke 101 as described in any of the examples above. The first planar coil 2, 71 receives a first line of a differentially signalled input signal received over two signal lines 102 and the second planar coil 3, 72 receives a second line of the differentially signalled input signal received over the two signal lines 102. The first and second planar coils 2, 71, 3, 72 provide a differentially signalled output signal over two signal lines 103. It will be appreciated that the electronic device 100 may include other electronic components, for signal processing for example.

The invention claimed is:

1. A common mode choke configured to receive a differential signal over a first signal channel and a second signal channel comprising:
   a first planar coil forming the first signal channel for receiving a first signal component of the differential signal,
   a second planar coil forming the second signal channel for receiving a second signal component of the differential signal, the first and second planar coils comprising substantially mirror images of one another and arranged side by side in a common plane,
   the first planar coil and second planar coil being electromagnetically coupled by a closed coupling loop, wherein the closed coupling loop comprises a first coil portion arranged in a path complementary to at least a portion of the first planar coil, a second coil portion arranged in a path complementary to at least a portion of the second planar coil, and
   a connecting portion arranged to connect the first and second coil portions to form a closed loop, wherein the connecting portion comprises:
      a first track and a second track, the first track configured to connect a first end of the first coil portion to a corresponding first end of the second coil portion and the second track configured to connect a second end of the first coil portion to a corresponding second end of the second coil portion, the first and second tracks being configured to extend in the same plane.

2. The common mode choke of claim 1, wherein the closed coupling loop is planar and configured to extend at least in part in a plane adjacent to but spaced apart from the common plane.

3. A common mode choke configured to receive a differential signal over a first signal channel and a second signal channel comprising:
   a first planar coil forming the first signal channel for receiving a first signal component of the differential signal,
   a second planar coil forming the second signal channel for receiving a second signal component of the differential signal, the first and second planar coils comprising substantially mirror images of one another and arranged side by side in a common plane,
   the first planar coil and second planar coil being electromagnetically coupled by a closed coupling loop, wherein the closed coupling loop comprises a first coil portion arranged in a path complementary to at least a portion of the first planar coil, a second coil portion arranged in a path complementary to at least a portion of the second planar coil, and
   a connecting portion arranged to connect the first and second coil portions to form a closed loop, wherein the connecting portion comprises:
      a first track and a second track, the first track configured to connect a first end of the first coil portion to a complementary first end of the second coil portion and the second track configured to connect a second end of the first coil portion to a complementary second end of the second coil portion, the first and second tracks being configured to extend in different planes.

4. The common mode choke according to claim 1, wherein the common mode choke is symmetrical about a plane extending between the first and second planar coils.

5. The common mode choke of claim 1, further comprising: a plurality of closed coupling loops, wherein each of the plurality of closed coupling loops are configured to electromagnetically couple the first and second planar coils.

6. The common mode choke of 5, wherein at least two of the plurality of closed coupling loops extend in the same plane.

7. The common mode choke of claim 5, wherein one or more of the plurality of closed coupling loops extends in plane above the common plane and one or more of the plurality of closed coupling loops extends in plane below the common plane.

8. The common mode choke of claim 1, wherein the first planar coil includes a straight section and a coiled section and the second planar coil includes a straight section and a coiled section, and wherein the straight sections of the first and second planar coils are arranged parallel to one another.

9. The common mode choke of claim 5, wherein the number of closed coupling loops is equal to or one greater than the number of turns of the first or second planar coil.

10. The common mode choke of claim 1, wherein one or both of the first planar coil and the second planar coil comprises spirals and have an outer spiral end and an inner spiral end arranged in the common plane, and wherein the inner spiral end connects to a bridge track that extends in a plane adjacent to but spaced apart from the common plane to provide a connection point that lies outside of the spiral.

11. The common mode choke of claim 1, wherein the first planar coil and the second planar coil are each arranged over a plurality of parallel planes, with corresponding parts of the first planar coil and the second planar coil being arranged in common planes of the plurality of parallel planes.

12. An electronic device including the common mode choke of claim 1.

13. The electronic device of claim 12 comprising a transmitter or a receiver configured to transmit or receive the differential signal arranged over the two signal channels wherein the first planar coil of the common mode choke is configured to connect to one of the first and second signal channels and the second planar coil of the common mode choke is configured to connect to the other of the first and second signal channels.

14. An electronic device including the common mode choke of claim 3.

15. The electronic device of claim 14, further comprising a transmitter or a receiver configured to transmit or receive the differential signal arranged over the two signal channels wherein the first planar coil of the common mode choke is configured to connect to one of the first and second signal channels and the second planar coil of the common mode choke is configured to connect to the other of the first and second signal channels.

* * * * *